United States Patent
Madson et al.

(10) Patent No.: US 6,291,310 B1
(45) Date of Patent: Sep. 18, 2001

(54) METHOD OF INCREASING TRENCH DENSITY FOR SEMICONDUCTOR

(75) Inventors: Gordon K. Madson, Riverton; Joelle Sharp, Herriman, both of UT (US)

(73) Assignee: Fairfield Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/447,933

(22) Filed: Nov. 24, 1999

(51) Int. Cl.$^7$ ................................................. H01L 21/76
(52) U.S. Cl. ........................ 438/424; 438/430; 438/435
(58) Field of Search .................................. 438/424, 430, 438/435

(56) References Cited

U.S. PATENT DOCUMENTS 5,268,311 * 12/1993 Euen et al. .
5,897,360 * 4/1999 Kawaguchi .
5,906,680 * 5/1999 Meyerson .

* cited by examiner

*Primary Examiner*—Long Pham
(74) *Attorney, Agent, or Firm*—Townsend & Townsend & Crew LLP; William E. Winters

(57) ABSTRACT

A method of increasing trench density for semiconductor devices such as, for example, trench MOSFETs. Trenches are formed in a substrate with mesas interposed between the trenches. The initial width of the mesas are made less than target width so that a reduction in trench pitch can be realized. After a silicon layer is grown inside the trenches, the width of the mesas is increased to a final width that is two times the thickness of the silicon layer. The thickness of the silicon layer is precalculated so that it is of sufficient thickness to ensure compliance with the target mesa width.

12 Claims, 7 Drawing Sheets

METHOD OF INCREASING TRENCH DENSITY FOR SEMICONDUCTOR

BACKGROUND OF THE INVENTION

The present invention relates in general to semiconductor technology, and in particular, to increasing the density of trenches for applications such as power Metal Oxide Semiconductor Field Effect Transistors (MOSFETs).

Integrated circuit manufacturers continually strive to increase the number of devices that can be formed across a single wafer. Power MOSFETs, due to their required large gate areas, typically occupy the entire area of a die on a semiconductor wafer. In conventional power MOSFETs, these required large gate areas pose a limit on the number of dies that can be realized per wafer(i.e. "die density"). One way to overcome this limit is to form a trench into the wafer and use its recess to form a three-dimensional gate. A three dimensional gate reduces the two-dimensional surface dimensions of a die (i.e. the "die size") without sacrificing gate area. Power transistors of this type are often referred to in the art as "Power Trench MOSFETs."

A cross-sectional view of a typical trench MOSFET 10, which can be used for power applications, is shown in FIG. 1. It includes an n-type substrate 102 upon which an n-type epitaxial layer (not shown in FIG. 1) is typically grown. The substrate 102 embodies the drain of the trench MOSFET 10. A p-type body layer 108 covers the epitaxial layer. A pair of trenches 100 extend through the body layer 108 and into the epitaxial layer. Dielectric layers 104 are formed on the walls of the trenches 100. The dielectric layers 104 have inner walls facing towards the centers of their respective trenches 100 and outer walls. N+ source regions 10 flank the outer walls of the dielectric layers 104 and extend into the body layer 108. Heavy body regions 112, also within the body layer 108, are positioned between the source regions 110. Conductive layers 106 (e.g., polysilicon) substantially fill the trenches 100 and embody the gate of the trench MOSFET 10. Finally, dielectric caps 114 cover the filled trenches 100 and also partially cover the source regions 110.

During fabrication of the trench MOSFET 10 an anisotropic etch step is typically performed to form the trenches 100. An anisotropic etch is used, as opposed to an isotropic etch, since an anisotropic etch etches substantially in one direction, which in this case, is vertical and downward. The substantially vertical trenches 100 help to maintain the width defined by the trench patterns, a characteristic that is beneficial in maintaining a predetermined distance between the centers of the trenches 100 (i.e., trench pitch).

After the trenches 100 are formed, a rounding etch is typically performed to round corners, which form at the top and bottom of the trenches 100 during the trench etch step. Another step that is typically performed just prior to growing the gate oxide for the trench MOSFET 10, is the growing of a sacrificial oxide, which is grown and then stripped to remove defects from the walls of the trenches.

To increase the trench density, it is desirable to minimize the trench width as well as the trench pitch. However, both of these dimensions are limited by constraints imposed by manufacturing equipment as well as device operational requirements. The minimum reliably manufacturable trench width is generally dictated by the capability of the photolithography equipment. Further, the minimum width of the mesa formed between trenches is defined by the source and heavy body regions and the source contact areas.

What is needed, therefore, is a method that can overcome limitations on the minimum achievable trench width and trench pitch to provide electronic devices, such as trench MOSFETs, with a higher trench density despite limits imposed by minimum lithographic print dimension capabilities, and without violating the minimum allowable mesa width.

SUMMARY OF THE INVENTION

The present invention provides a method of increasing the trench density of a trench MOSFET by reducing the effective pitch between adjacent trenches of a trench MOSFET. Pitch reduction is accomplished by first patterning adjacent trenches so that the mesa between the trenches has a width less than the minimum allowable mesa width. After the trenches are formed, a silicon layer is grown on the walls of the trenches, to a thickness that effectively widens the mesa between adjacent trenches to a width that is greater than or equal to the minimum allowable mesa width. Preferably, the thickness of the silicon layer is selected such that the final width of the mesa approaches the minimum allowable mesa width. By doing this, a maximum reduction in trench pitch can be realized.

In one aspect of the method of the present invention, selective areas (or "trench opening accesses") of a substrate are defined. Through these trench opening accesses, trenches are formed into the substrate, preferably by using an anisotropic etch. Once the trenches are formed, the trenches are optionally annealed, preferably using hydrogen gas at elevated temperatures and sub-atmospheric pressures so that corners at the tops and bottoms of the trenches become rounded and so that the defect density on the walls of the trenches is reduced. This anneal process is described in commonly-assigned patent application Ser. No. 09/448,884, entitled "Hydrogen Anneal for Creating an Enhanced Trench for Trench MOSFETs." Finally, a layer of silicon is formed on the trench walls, preferably by epitaxial deposition, to ensure that the mesa width is greater than or equal to the minimum allowable mesa width.

In yet another aspect of the invention, the method of the present invention is used to fabricate a trench MOSFET characterized by a reduced trench pitch. The method comprises the steps of: (i) providing a substrate of a first dopant charge type; (ii) growing a base silicon layer of the same first dopant charge type on the substrate; (iii) forming at least two trenches into the base silicon layer, each trench defined by a first end in a plane defined by a major surface of the substrate and by walls that extend to a second end at a trench-terminating depth into the base silicon layer; (iv) annealing the trenches to (a) reduce the number of defects on the walls of the trenches and (b) round corners at the first and second ends of the trenches; (v) growing a second layer of silicon on the trench walls, preferably by epitaxial deposition, to ensure that the width of the mesa between adjacent trenches of the trench MOSFET is greater than or equal to the minimum allowable mesa width; (vi) growing a dielectric layer over said second layer of silicon; (vii) forming a conductive layer over said dielectric layer, said conductive layer embodying the gate of the trench MOSFET; (viii) patterning and implanting a dopant of a second charge type to form wells interposed between adjacent trenches; and (ix) patterning and implanting a dopant of the first charge type to form regions that embody the source regions of the trench MOSFET.

Other features and advantages of the invention will be apparent from the following detailed description and the drawings.

DESCRIPTION OF THE SPECIFIC EMBODIMENTS

Figure 1:
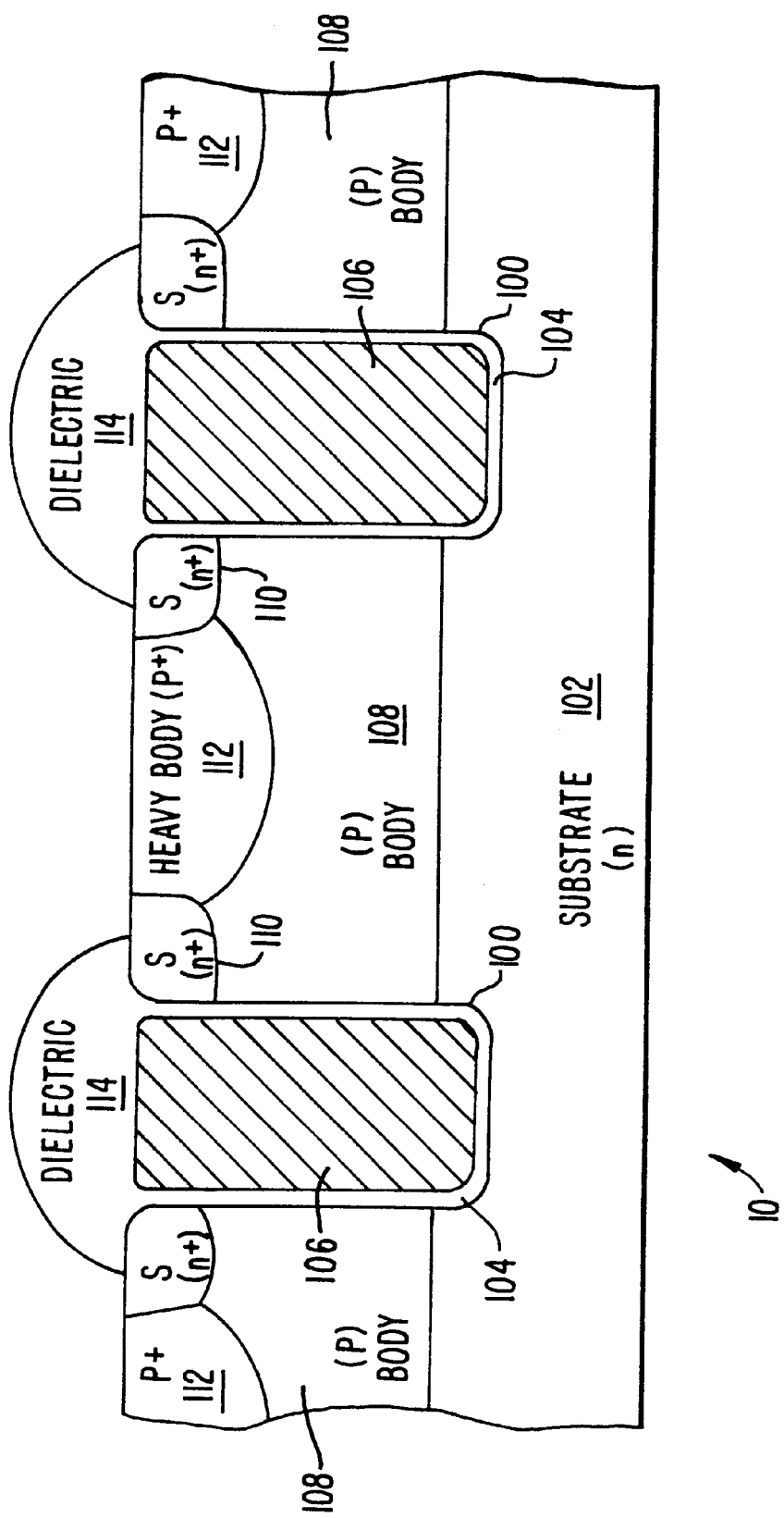
FIG. 1 is a cross-sectional view of a typical trench MOSFET, which can be utilized in power applications.
Figure 2:
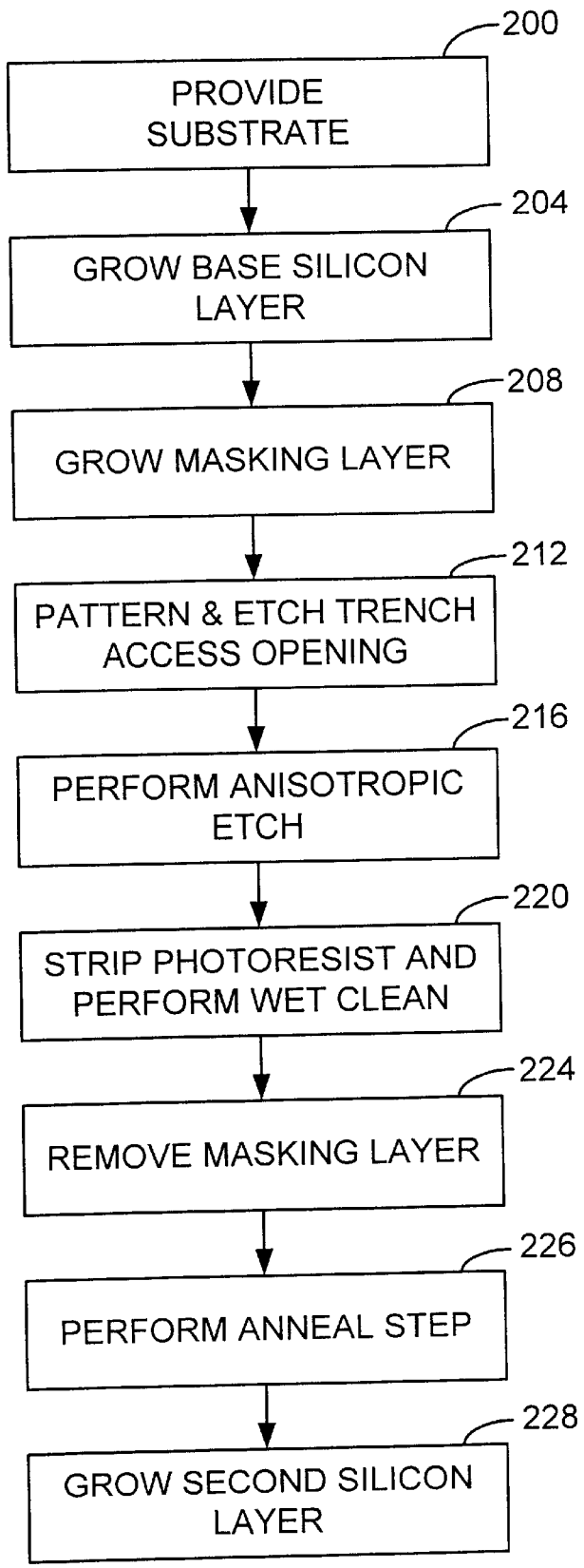
FIG. 2 is a flow diagram showing an exemplary process flow for manufacturing trenches having a reduced trench pitch, according to the method of the present invention.

Referring to FIG. 2, there is shown a flow diagram illustrating an exemplary process flow for manufacturing a pair of trenches characterized by a reduced trench pitch, according to the present invention. The following description of the steps in the process flow is only exemplary and it should be understood that the scope of the invention is not limited to this particular example. In particular, processing conditions such as temperature, pressure, layer thicknesses, and the like could be varied, without departing from the spirit of the invention. The process flow of FIG. 2 will now be described in connection with FIGS. 3A through 3I.

The first step 200 in the process flow (See FIG. 2) is to provide a semiconductor substrate 10. (See FIG. 3A.) In this description, the substrate 10 is taken to be, for the sake of example, n-type and having a standard thickness of about 500 μm.

Next, in step 204, a base silicon layer 20 is grown on the substrate 10, preferably by epitaxial deposition and preferably to a thickness of from about 4 to 10 μm. (See FIG. 3B.) The resistivity of the base silicon layer 20 is typically from about 0.1 Ω-cm to 3.0 Ω-cm.

Figure 3A:
FIG. 3A is a cross-sectional view of a semiconductor substrate.
Figure 3B:
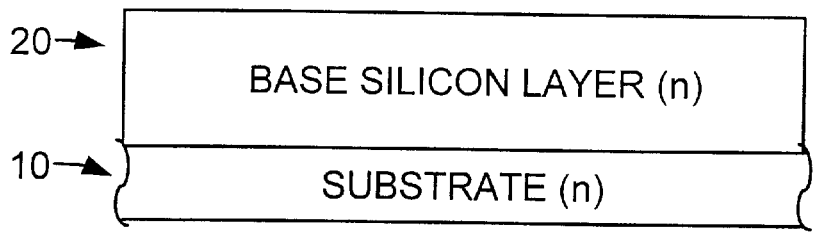
FIG. 3B is a cross-sectional view of the result of growing a base silicon layer on the substrate of FIG. 3A.
Figure 3C:
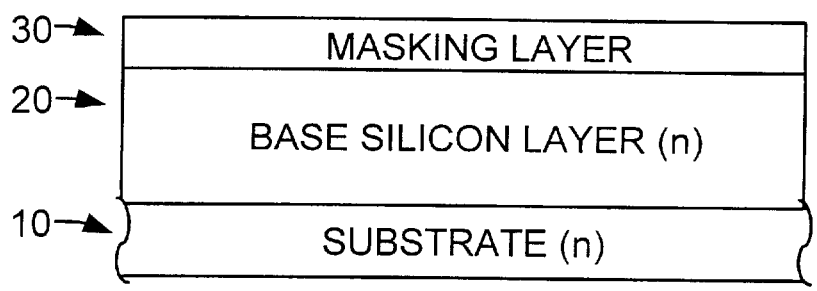
FIG. 3C is a cross-sectional view of the result of growing a masking layer on the base silicon layer of FIG. 3B.
Figure 3D:
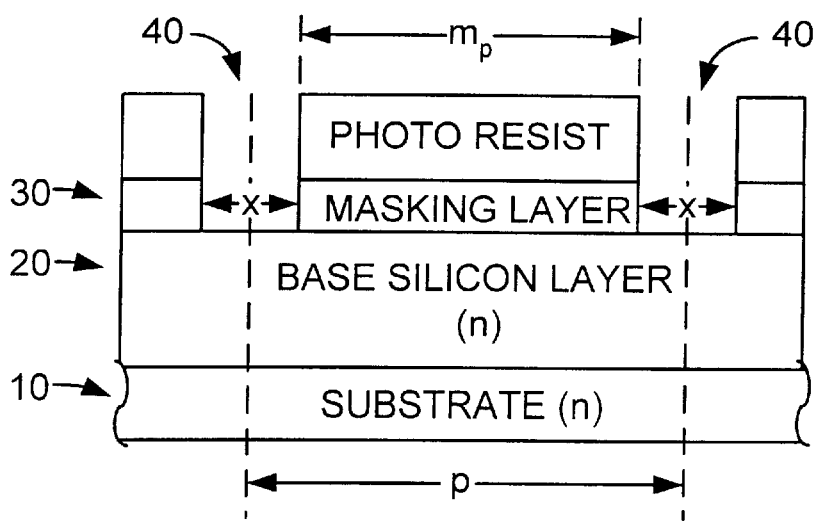
FIG. 3D is a cross-sectional view of the result of patterning and etching through the photo resist and masking layers of FIG. 3C to define trench opening accesses.
Figure 3E:
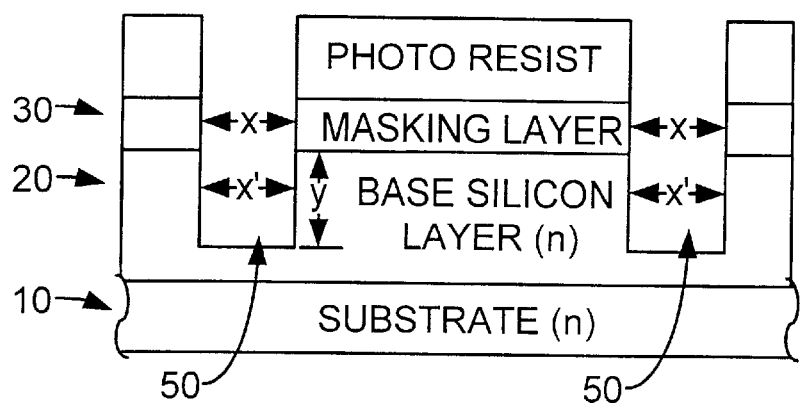
FIG. 3E is a cross-sectional view of the result of performing an anisotropic etch into the trench opening accesses and through the base silicon layer to form trenches.

In step 208, a masking layer 30 is grown over the base silicon layer 20, as shown in FIG. 3C. Preferably, the masking layer 30 is a material made of silicon dioxide ($SiO_2$) and is grown to a thickness of around 1000 Å.

In step 212, the masking layer 30 is patterned and then selectively etched using, for example, a buffered oxide etch (e.g. hydroflouric acid (HF) buffered with ammonium fluoride ($NH_4F$)). Trench opening accesses 40 are thereby formed into the masking layer 30 to a depth that just reaches the surface of the base silicon layer 20. The minimum obtainable trench opening access width, x, (refer to FIG. 3D) is determined by the optical capabilities of the photolithogaphy equipment. Using standard ultraviolet lithography, a typical width of the trench opening access is, x~0.45 μm. Nevertheless, the patterned width, $m_p$, between adjacent trench opening accesses 40 is patterned to a dimension that is less than the minimum allowable mesa width. Later in the process, when a second layer of silicon is grown on the walls of the trenches and on the mesas between trenches, the mesa width will increase to a final width, $m_f$, which is greater than, but preferably approximate to, the minimum allowable mesa width.

In step 216, an anisotropic etch is performed. An anisotropic etch, as it is meant here, is a dry etch that etches substantially in one direction, as compared to an isotropic etch, which etches in more than one direction. Hence, the anisotropic etch step 216 is used to etch substantially vertical trenches 50 into the base silicon layer 20. Typically, the dry etch is in the form of a plasma, which is an almost neutral mixture of energetic molecules, ions and electrons, which have been excited in a radio-frequency electric field. Different gases are used in a plasma etch, depending on the material to be etched. The principal consideration is that the reaction products be volatile. For etching silicon, the preferred reactants are Cl, HBr, $HeO_2$, the preferred pressure is 150 mTorr (or ~20 Pa) and the duration of the etch is approximately 235 seconds.

The depth, y, of the trenches 50 (refer to FIG. 3E) is preferably about 1.5 μm and the width, x', of the trenches 50, is approximately 0.42 μm at approximately 0.25 μm deep into the trenches 50.

Figure 3F:
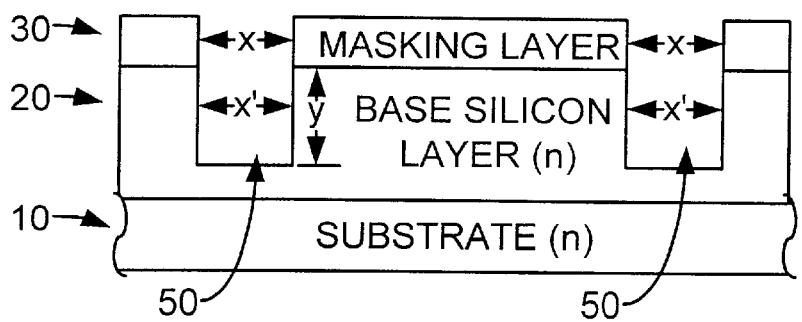
FIG. 3F is a cross-sectional view of the result of stripping the photo resist layer of FIG. 3E.

In step 220, the patterned photoresist is stripped and the trenches 50 are wet-cleaned to remove debris left over from the previous steps. The end result is shown in FIG. 3F.

Figure 3G:
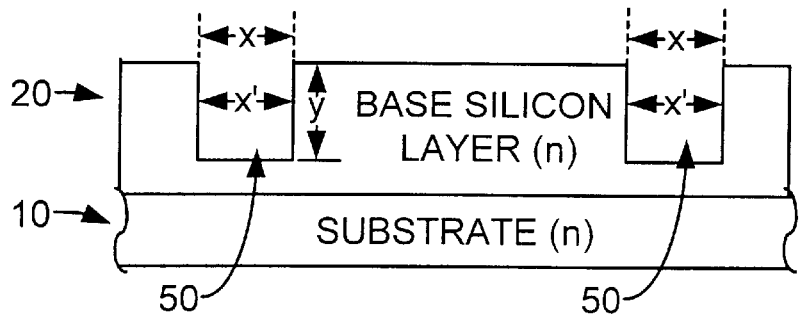
FIG. 3G is a cross-sectional view of the result of removing the masking layer of FIG. 3F.

In step 224, the masking layer 30 is removed using, for example, a wet etch process. The end result of this step is shown in FIG. 3G.

Figure 3H:
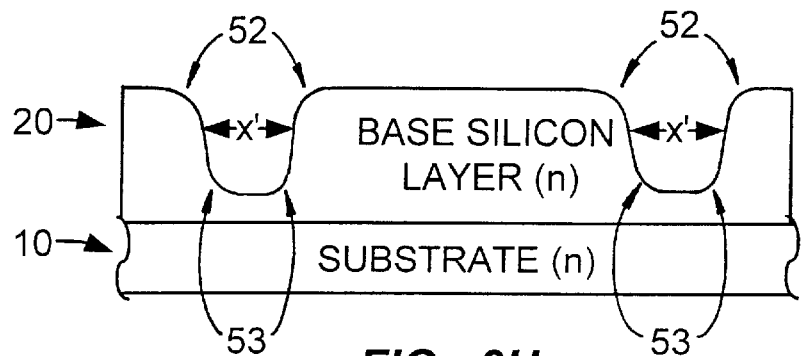
FIG. 3H is a cross-sectional view of the result of performing an anneal to round corners at the tops and bottoms of the trenches.

In step 226, an anneal is performed. Preferably, the anneal is performed using hydrogen gas at a temperature of approximately 1100° C. and a pressure of approximately 100 Torr (or ~1.3×10$^4$ Pa). The anneal step has the effect of not only reducing the defect density of the base silicon layer 20 but it also has the effect of causing the upper and lower corners 52 and 53 of the trenches 50 to become rounded, as shown in FIG. 3H. Other temperatures and pressures can also be used in the anneal process. For example, the process can also cause the altering of the shape of the corners of the trenches 50 at temperatures within the range of 1060 to 1160° C. and pressures within the range of 40 to 240 Torr (or ~5.3×10$^3$ to 3.2×10$^4$ Pa).

A more detailed account of the anneal step 228 and the benefits it provides are described in commonly-assigned patent application Ser. No. 09/448,884, entitled "Hydrogen Anneal for Creating an Enhanced Trench for Trench MOSFETs." which is hereby incorporated by reference in its entirety.

Figure 3I:
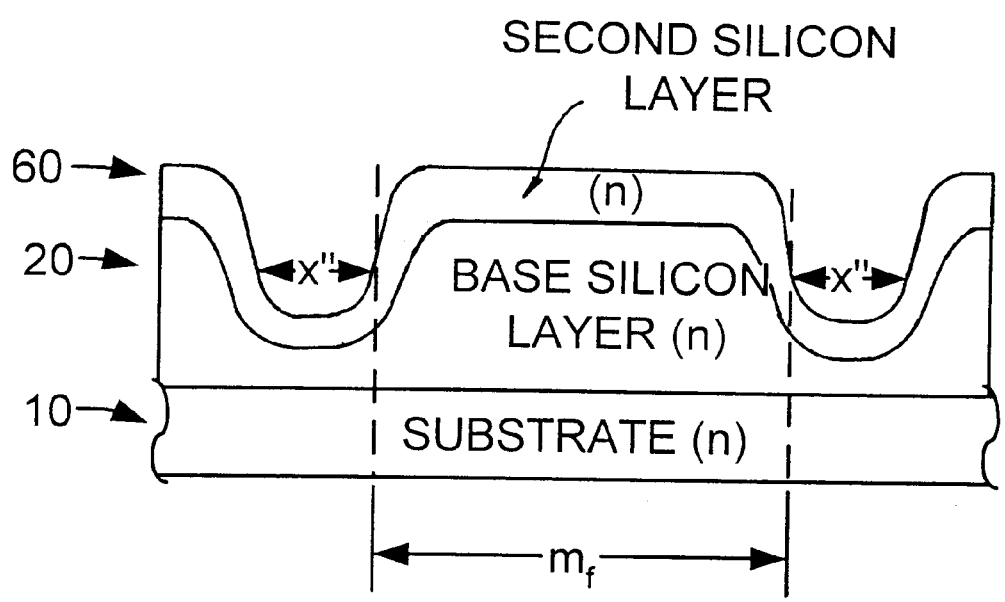
FIG. 3I is a cross-sectional view of the result of growing a second layer of silicon on the walls of the trenches and on the mesas between trenches.

In step 228, a high-quality second layer of silicon 60 is grown on the walls of the trenches 50 and on the mesas between the trenches, preferably by epitaxial deposition. Preferably, the thickness, x", of the second silicon layer 60 is between 500 to 1000 Å, as shown in FIG. 3I, although other thicknesses may be used as needed to insure that the minimum allowable mesa width is complied with. Growing the second silicon layer 60 functions to heal defects in the trenches 50 so that it lends itself as an undamaged silicon surface primed for gate oxide growth.

Figure 4:
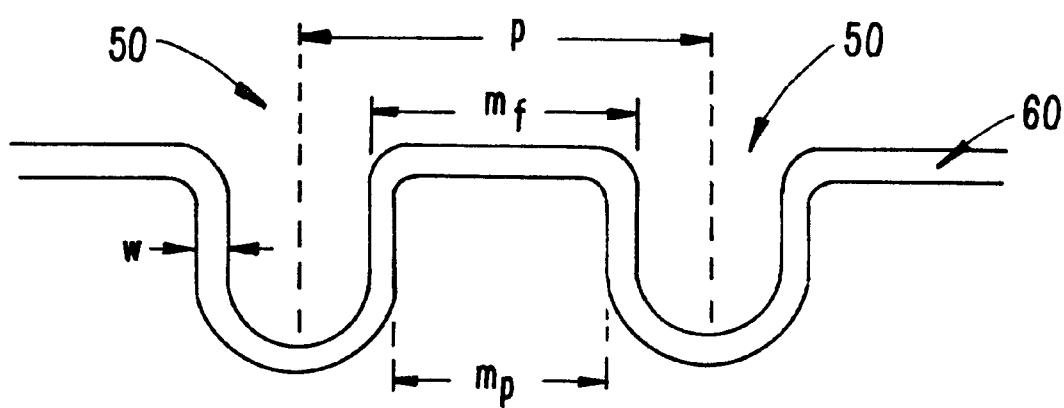
FIG. 4 is a cross-sectional diagram of a pair of trenches showing the pitch, p, between trenches, the width, W, of the second silicon layer, and the patterned and final mesa widths, $m_p$ and $m_f$.

FIG. 4 illustrates the extent to which the trench pitch, p, is reduced in accordance with the present invention. The addition of the second silicon layer 60 increases the patterned mesa width, $m_p$, to a final width, $m_f$, which is two times the second silicon layer 60 thickness, i.e. 2 W. The trench pitch, p, is correspondingly reduced by 2 W. Preferably, the width of the second silicon layer 60 is chosen so that the final mesa width, $m_f$, is approximately equal to the minimum allowable mesa width so that trench pitch reduction can be maximized.

Comparing FIG. 3E to FIG. 3I, it is seen that the first trench width of, x'~0.42 µm, is reduced to a second trench width of x"~0.35 µm at approximately 0.25 µm deep into the trenches 50. This reduction in trench width reduces the surface area and volume of the trench, which may result in increased gate resistance for trench MOSFET applications. Nevertheless, this problem can be overcome by using a low resistance gate material such as, for example, a silicide or a metal plug (e.g. tungsten). Methods for manufacturing trench MOSFETs having trench gates made of low resistivity materials are described in greater detail in commonly-assigned patent application Ser. No. 09/343,330, entitled "Trench Structure Substantially Filled with High Conductivity Material," by Mo et al., which is hereby incorporated by reference in its entirety.

Figure 5:
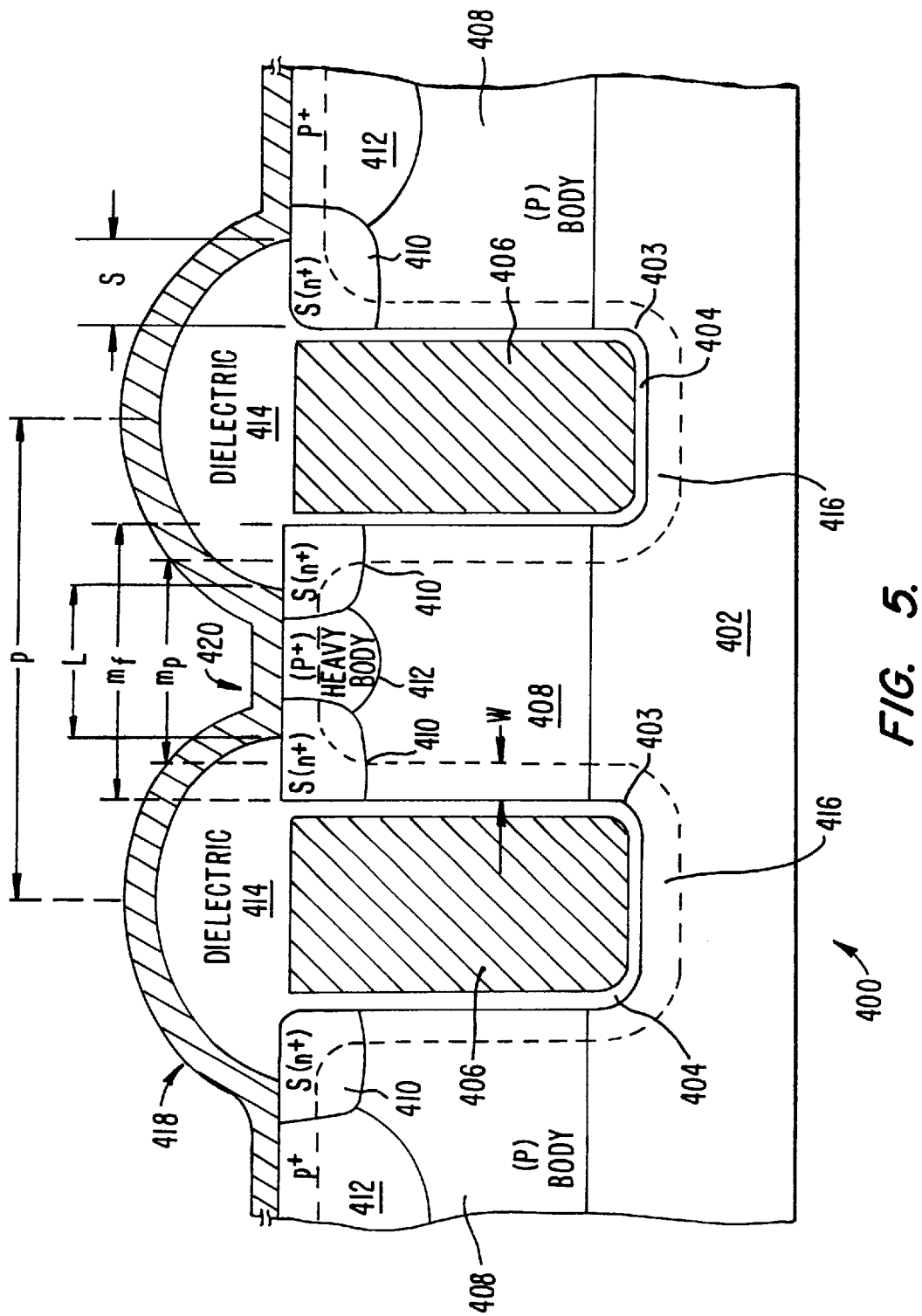
FIG. 5 is a cross-sectional view of a trench MOSFET fabricated in accordance with the present invention.

FIG. 5 shows a simplified cross-section of a portion of a trench MOSFET 400 manufactured using the method of the present invention. The trench MOSFET 400 includes an n-type substrate 402 upon which an n-type base silicon layer (not shown in FIG. 5) is typically grown. The substrate 402 embodies the drain of the trench MOSFET 400. A p-type body layer 408 covers the base silicon layer. A pair of trenches 403 extend through the body layer 408 and into the base silicon layer. A second silicon layer 416, having a width W, covers the walls of the trenches 403 and comprises parts of the sources 410 and heavy body regions 412. Dielectric layers 404 are formed on the walls of the of the second silicon layer 416. The dielectric layers 404 comprise the gate oxide of the trench MOSFET 400 and have inner walls facing towards the centers of their respective trenches 403 and outer walls. N+ source regions 410 flank the outer walls of the dielectric layers 404 and extend into the body layer 408. Heavy body regions 412, also within the body layer 408, are positioned between the source regions 410. Conductive layers 406 substantially fill the trenches 403 and embody the gate of the trench MOSFET 400. Next, dielectric caps 114 cover the filled trenches 403 and also partially cover the source regions 410. Finally, a conductive layer 418 is formed over the upper surface of the trench MOSFET 400 to form contacts for the trench MOSFET 400. A contact opening 420, defined by the final mesa width, $m_f$, and spacing, L, between the corners of dielectric caps 114, is optimized so that the contact resistance of heavy body 412 and source 410 are minimized and so that adequate step coverage can be achieved during formation of conductive layer 418. The widths, s, from the corner of the dielectric caps 414 to the nearest metal contacts are optimized so that the gate-to-source leakage current, Igs, and gate-to-source capacitance, Cgs, are minimized.

The present invention, when used to fabricate a trench MOSFET such as that shown in FIG. 5, provides method for reducing the trench pitch by two times the thickness of the silicon layer 416. This is the same dimension at which the mesa width changes from its patterned width, $m_p$, to its final width, $m_f$. In other words, the reduction in pitch is $\Delta p = 2 W = m_f - m_p$.

The trench MOSFET 400 of FIG. 5 is also preferably fabricated using the hydrogen anneal step 226 described above. Other processing details of the trench MOSFET of FIG. 5 are described in commonly-assigned U.S. patent application Ser. No. 08/970,221, entitled "Field Effect Transistor and Method of Its Manufacture," which is hereby incorporated by reference in its entirety.

Although the invention has been described in terms of a preferred method and structure, it will be obvious to those skilled in the art that many modifications and alterations may be made to the disclosed embodiment without departing from the spirit of the invention. For example, whereas the method of the present invention can be utilized to fabricate trench MOSFETs characterized by a reduction in trench pitch, the trench pitch reducing method of the present invention should not be viewed as being limited to fabrication of such devices.

What is claimed is:

1. A method of reducing the pitch between a pair of trenches formed in a substrate, said method comprising the steps of:

forming a pattern of a pair of trench opening accesses on said substrate, said pair of trench opening accesses being separated by a mesa definition having a patterned mesa width that is greater than or equal to a minimum width allowed by a photolithography tool;

forming said pair of trenches, through said pair of trench opening accesses and into said substrate, so that said pair of trenches is separated by said patterned mesa width; and growing a layer of silicon, by epitaxial deposition, on sidewalls of said pair of trenches to increase said patterned mesa width to a final mesa width that is greater than or equal to a minimum width required to form an active region for an electronic device.

2. The method of claim 1, wherein said step of patterning comprises the steps of:

growing a hard mask on said surface of said substrate; and photolithographically defining said pair of trench opening accesses in said hard mask.

3. The method of claim 2 wherein said step of forming is performed using an anisotropic etch.

4. The method of claim 3, further comprising a step of annealing the sidewalls of said pair of trenches using hydrogen gas, prior to said step of growing a layer of silicon, to reduce a defect density on said walls of said pair of trenches and to cause upper and lower corners at the tops and bottoms of said pair of trenches to become rounded.

5. The method of claim 4, wherein said step of annealing is performed within a temperature range of about 960 to 1160° C. and within a pressure range of about 40 to 240 Torr.

6. The method of claim 5, wherein said method is used to fabricate a trench field effect transistor.

7. A method of making a trench field effect transistor, comprising the steps of:

providing a semiconductor substrate of a first dopant charge type;

growing a first base silicon layer of the same first dopant charge type on said substrate;

forming two or more trenches into said first base silicon layer, each trench defined by a first end in a plane defined by a major surface of said substrate and by walls extending to a second end at a first depth into said first base silicon layer, wherein mesas separating adjacent trenches have initial widths that are smaller than a minimum allowable width;

growing a second layer of silicon on said walls of said trenches and said mesas so that said initial mesa widths conform to a final width that is greater than or equal to said minimum allowable width;

growing a dielectric layer over said second layer of silicon;

forming a conductor over said dielectric layer, said conductor embodying the gate of said trench field effect transistor;

forming a pattern and implanting a dopant of a second charge type to form wells interposed between said trenches; and forming a pattern and implanting a dopant of said first charge type to form regions that embody the source regions of said field effect transistor.

8. The method of claim 7, further comprising the step of:

annealing said trenches, prior to said step of growing a second layer of silicon, to:

reduce the number of defects on said walls of said trenches, and round corners at said first and second ends of said trenches.

9. The method of claim 8, wherein said annealing step is performed using hydrogen gas, within a temperature range of 960 to 1160° C., and within a pressure range of 40 to 240 Torr.

10. A method of making a trench field effect transistor, comprising the steps of:

providing a semiconductor substrate of a first dopant charge type, growing a base silicon layer of the same first dopant charge type on said substrate;

forming two or more trenches into said base silicon layer, each trench defined by a first end in a plane defined by a major surface of said substrate and by walls extending to a second end at a first depth within said base silicon layer, wherein mesas separating adjacent trenches have initial widths that are smaller than a minimum allowable mesa width;

annealing said trenches, prior to said step of growing a layer of silicon in order to:

reduce the number of defects on said walls of said trenches, and round corners at said first and second ends of said trenches;

growing a second layer of silicon on said walls of said trenches and on said mesas between said trenches so that said mesa widths conform to a final width that is approximately greater than or equal to said minimum allowable mesa width;

growing a dielectric layer over said second layer of silicon;

forming a conductive layer over said dielectric layer, said conductive layer embodying the gate of said trench MOSFET;

patterning and implanting a dopant of a second charge type to form wells interposed between trenches; and patterning and implanting a dopant of said first charge type to form regions that embody the source regions of said MOSFET.

11. The method of claim 10, wherein said annealing step is performed using hydrogen gas, within a temperature range of 960 to 1160° C., and within a pressure range of 40 to 240 Torr.

12. A method of reducing trench pitch between trenches formed in a substrate, the trenches separated by a mesa having an initial width that is greater than or equal to a minimum width allowed by a photolithography tool, said method comprising the step of:

growing a layer of single crystalline silicon on walls that define the trenches so that the initial width is increased to a final width required to form an active region for an electronic device.

* * * * *

UNITED STATES PATENT AND TRADEMARK OFFICE
CERTIFICATE OF CORRECTION

PATENT NO.    : 6,291,310 B1
DATED         : September 18, 2001
INVENTOR(S)   : Madson et al.

It is certified that error appears in the above-identified patent and that said Letters Patent is hereby corrected as shown below:

Column 6,
Line 57, should read -- growing a first base silicon layer of a second dopant charge type... --

Column 7,
Lines 30-31, should read -- growing a base silicon layer of a second dopant charge type... --

Signed and Sealed this

Sixteenth Day of July, 2002

Attest:

Attesting Officer

JAMES E. ROGAN
Director of the United States Patent and Trademark Office